United States Patent
Shim et al.

(10) Patent No.: US 11,019,286 B2
(45) Date of Patent: May 25, 2021

(54) IMAGE SENSOR AND METHOD OF DRIVING THE SAME

(71) Applicant: SAMSUNG ELECTRONICS CO., LTD., Suwon-si (KR)

(72) Inventors: Hee Sung Shim, Hwaseong-si (KR); Kyung Ha Kim, Hwaseong-si (KR); Mi Ra Lee, Hwaseong-si (KR); Woong Joo, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 16/439,354

(22) Filed: Jun. 12, 2019

(65) Prior Publication Data

US 2020/0195863 A1  Jun. 18, 2020

(30) Foreign Application Priority Data

Dec. 13, 2018 (KR) .................. 10-2018-0160803

(51) Int. Cl.
| | |
|---|---|
| *H04N 5/341* | (2011.01) |
| *H04N 5/353* | (2011.01) |
| *H04N 5/378* | (2011.01) |
| *H01L 27/146* | (2006.01) |

(52) U.S. Cl.
CPC ............ *H04N 5/341* (2013.01); *H04N 5/353* (2013.01); *H01L 27/14634* (2013.01); *H04N 5/378* (2013.01)

(58) Field of Classification Search
CPC ........ H04N 5/341; H04N 5/353; H04N 5/378; H04N 5/3575; H04N 5/37452; H04N 5/374; H04N 5/345; H01L 27/14634
See application file for complete search history.

(56) References Cited

U.S. PATENT DOCUMENTS

| | | | | |
|---|---|---|---|---|
| 8,059,173 | B2* | 11/2011 | Walschap | H04N 5/3575 348/241 |
| 9,153,616 | B2* | 10/2015 | Kondo | H01L 27/14634 |
| 9,160,956 | B2 | 10/2015 | Lahav et al. | |
| 9,324,746 | B2 | 4/2016 | Choi et al. | |
| 9,706,142 | B2 | 7/2017 | Hynecek | |
| 9,888,199 | B2* | 2/2018 | Gomi | H01L 27/14618 |
| 10,002,901 | B1* | 6/2018 | Xu | H04N 5/37452 |
| 2006/0232580 | A1 | 10/2006 | Koyama | |
| 2006/0261251 | A1 | 11/2006 | Fossum | |
| 2009/0108176 | A1 | 4/2009 | Blanquart | |
| 2011/0194007 | A1 | 8/2011 | Kim et al. | |

(Continued)

*Primary Examiner* — Luong T Nguyen
(74) *Attorney, Agent, or Firm* — Lee IP Law, PC

(57) ABSTRACT

A pixel driving circuit of an image sensor includes a first transistor to transmit an output signal of the photodiode to a floating diffusion node, a second transistor to reset a voltage of the floating diffusion node to a pixel voltage, a third transistor to output charges in the floating diffusion node, a fourth transistor to pre-charge an output node of the third transistor, a fifth transistor to transmit the charges in the floating diffusion node to a first node, a sixth transistor to transmit the pixel voltage to a second node, a seventh transistor to output charges in the second node, an eighth transistor to output an output signal of the seventh transistor to a column line, and a ninth transistor to output an output signal of the third transistor to the column line.

20 Claims, 14 Drawing Sheets

(56) References Cited

U.S. PATENT DOCUMENTS

| | | | |
|---|---|---|---|
| 2013/0070133 A1* | 3/2013 | Takazawa | H04N 5/379 348/294 |
| 2013/0256509 A1 | 10/2013 | Yang et al. | |
| 2016/0088251 A1* | 3/2016 | Luo | H04N 5/37452 250/208.1 |
| 2018/0227530 A1* | 8/2018 | Gomi | H04N 5/3745 |

* cited by examiner

EXPOSURE DRIVING 1 row readout (1H)

IMAGE SENSOR AND METHOD OF DRIVING THE SAME

CROSS-REFERENCE TO RELATED APPLICATION

Korean Patent Application No. 10-2018-0160803, filed on Dec. 13, 2018, in the Korean Intellectual Property Office (KIPO), and entitled: "Image Sensor and Method of Driving the Same," is incorporated by reference herein in its entirety.

BACKGROUND

1. Field

Embodiments relate an image sensor capable of supporting an operation of a global shutter method and a rolling shutter method, and a method of driving the same.

2. Description of the Related Art

Image sensors convert an optical image into an electrical signal. The number of photoelectrons that form the electrical signal may be determined by adjusting an exposure time of the image sensor. The exposure time may be adjusted using a rolling shutter method and a global shutter method. The rolling shutter method controls the time during which the photoelectrons are accumulated differently for each row of a pixel array. The global shutter method controls the time, during which the photoelectrons are accumulated, in the same manner for all rows of the pixel array.

SUMMARY

An image sensor according to an exemplary embodiment includes a pixel array in which a plurality of pixels are disposed, a row driver to supply a control signal to the plurality of pixels, a timing generator to control an operation of the row driver, and a readout circuit configured to output image signals of the plurality of pixels. Each of the plurality of pixels includes a photodiode and a pixel driving circuit. The pixel driving circuit includes a first transistor to transmit an output signal of the photodiode to a floating diffusion node, a second transistor to reset a voltage of the floating diffusion node to a pixel voltage, a third transistor to output charges in the floating diffusion node, a fourth transistor to pre-charge an output node of the third transistor, a fifth transistor to transmit the charges in the floating diffusion node to a first node, a sixth transistor to transmit the pixel voltage to a second node, a seventh transistor to output charges in the second node, an eighth transistor to output an output signal of the seventh transistor to a column line, and a ninth transistor to output an output signal of the third transistor to the column line.

An image sensor according to an exemplary embodiment includes a pixel array in which a plurality of pixels are disposed, a row driver to supply a control signal to the plurality of pixels, a timing generator to control an operation of the row driver, and a readout circuit to output image signals of the plurality of pixels. Each of the plurality of pixels includes a photodiode and a pixel driving circuit. The pixel driving circuit includes a first transistor to transmit an output signal of the photodiode to a floating diffusion node, a second transistor to reset a voltage of the floating diffusion node to a pixel voltage, a third transistor to output charges in the floating diffusion node, a fourth transistor to pre-charge an output node of the third transistor, a fifth transistor to transmit the charges in the floating diffusion node to a first node, a sixth transistor to transmit the pixel voltage to a second node, a seventh transistor to output charges in the second node, an eighth transistor to output an output signal of the seventh transistor to a column line, and a ninth transistor to output an output signal of the third transistor to the column line. A clamping transistor connected to the column line, the photodiode, and the pixel driving circuit are distributed on a plurality of vertically stacked substrates.

A method of driving an image sensor according to an exemplary embodiment includes a global shutter driving method for an image sensor including a plurality of pixels including a photodiode and a plurality of transistors. A first transistor is connected to the photodiode and a floating diffusion node. A second transistor is connected to the floating diffusion node and a pixel voltage. A third transistor is controlled by the floating diffusion node and connected to the pixel voltage. A fourth transistor is connected to the third transistor and ground. A fifth transistor is connected to the third transistor and a first node. A sixth transistor is connected to the fifth transistor and a second node. A seventh transistor is connected to the second node and the pixel voltage. An eighth transistor is connected to the seventh transistor and a column line. A ninth transistor is between the third transistor and the column line. The method includes, during a reset settling time, in which the fourth to sixth transistors are on, turning on the ninth transistor to output an output of the third transistor to the column line, and turning off the sixth and ninth transistors after the reset settling time.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, an image sensor and a method of driving the same according to example embodiments will be described with reference to the accompanying drawings as follows.

Figure 1:
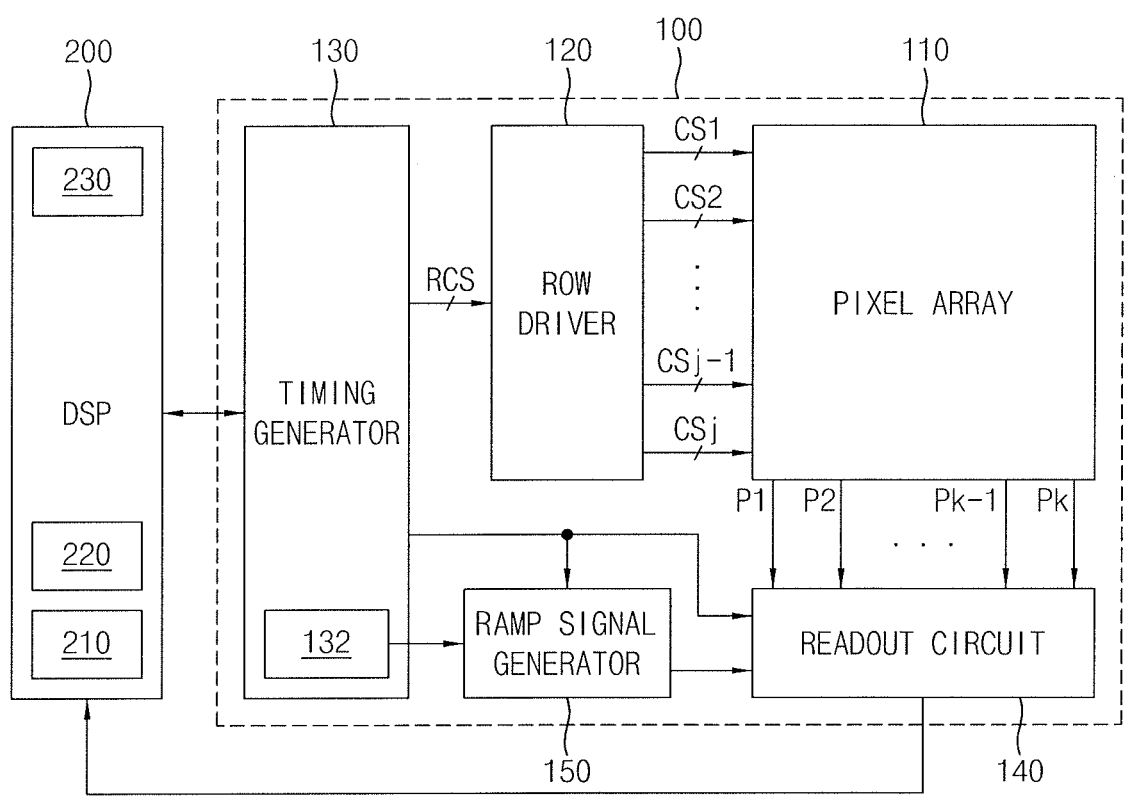
FIG. 1 illustrates an image processing system including an image sensor according to an embodiment.
Figure 2:
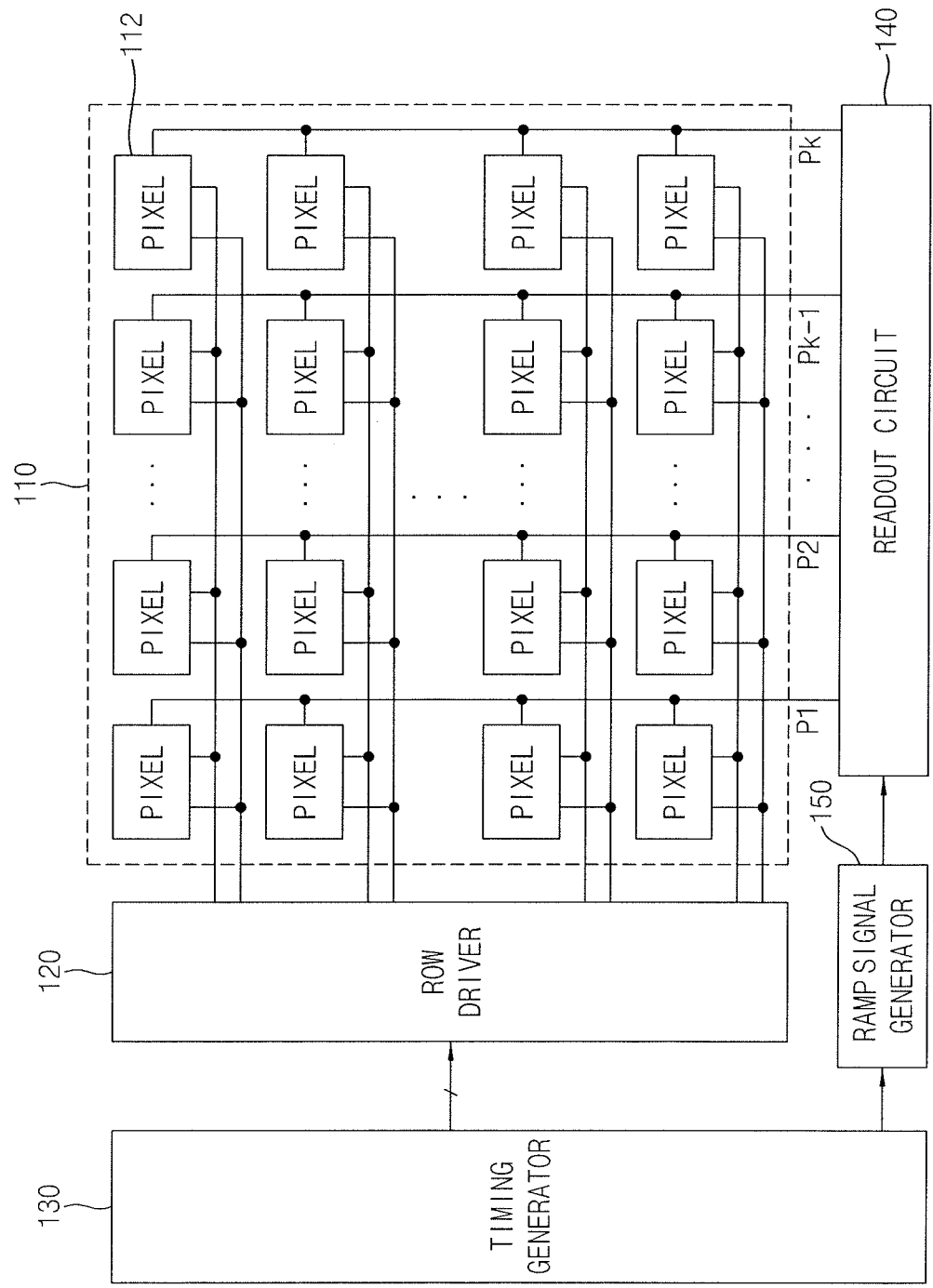
FIG. 2 illustrates a view of the image sensor shown in FIG. 1.

FIG. 1 illustrates an image processing system including an image sensor according to an embodiment. FIG. 2 illustrates the image sensor shown in FIG. 1.

Referring to FIGS. 1 and 2, the image processing system includes an image sensor 100 and a digital signal processor (DSP) 200. The image sensor 100 and the DSP 200 may each be implemented as one chip or may be implemented together as a single chip.

The image sensor 100 may generate a digital pixel signal for a subject input through an optical lens. The image sensor 100 may include a pixel array 110, a row driver 120, a timing generator 130, a readout circuit 140, and a ramp signal generator 150.

The pixel array 110 may include a plurality of pixels 112 arranged in a matrix. As one example, the pixel array 110 may include the plurality of pixels 112 arranged in the matrix in which each of the pixels 112 is connected to a plurality of row lines and a plurality of column lines, respectively. The plurality of pixels 112 may form an active pixel sensor (APS).

The pixel 112 may include a red filter that passes red light, a green filter that passes green light, and a blue filter that passes blue light. In an implementation, the pixel 112 may include a transparent filter or a color filter that transmits light in other wavelength regions. As one example, the pixel 112 may include a white color filter, a cyan color filter, a magenta color filter, and/or a yellow color filter.

The pixel 112 may include a plurality of transistors (see FIG. 5A) and a photodiode PD. Each of the plurality of pixels 112 may sense light using the photodiode PD and convert the sensed light into an electrical signal to generate an image signal. A structure and operation of each of the plurality of pixels 112 will be described with reference to FIG. 5A. Each of the plurality of pixels 112 may be defined as a unit pixel and the plurality of pixels 112 form one pixel array 110.

The row driver 120 may generate a plurality of row control signals CS1 to CSj on the basis of a plurality of row driver control signals RCS received from the timing generator 130. The row driver 120 may transmit the plurality of row control signals CS1 to CSj to the pixel array 110 to control an operation of each of the plurality of pixels 112 under the control of the timing generator 130. Each of the plurality of row control signals CS1 to CSj corresponds to each of the j rows of the pixel array 110, and thus the pixel array 110 may be controlled row by row. Each of the plurality of row control signals CS1 to CSj may include an overflow control signal, a storage control signal, a transfer control signal, a reset control signal, and a selection control signal. In response to the row control signals CS1 to CSj provided from the row driver 120, the pixel array 110 may output a reset signal and an image signal generated from the selected one or more rows to the readout circuit 140.

The timing generator 130 may include a control register block 132. The control register block 132 may control the operation of the timing generator 130, a ramp signal generator 150, and the readout circuit 140 under the control of the DSP 200. The timing generator 130 may generate the row driver control signals RCS so that the image sensor 100 operates in a global shutter or rolling shutter mode depending on the operation mode thereof. The row driver control signals RCS generated in the timing generator 130 may be input to the row driver 120.

Figure 3A:
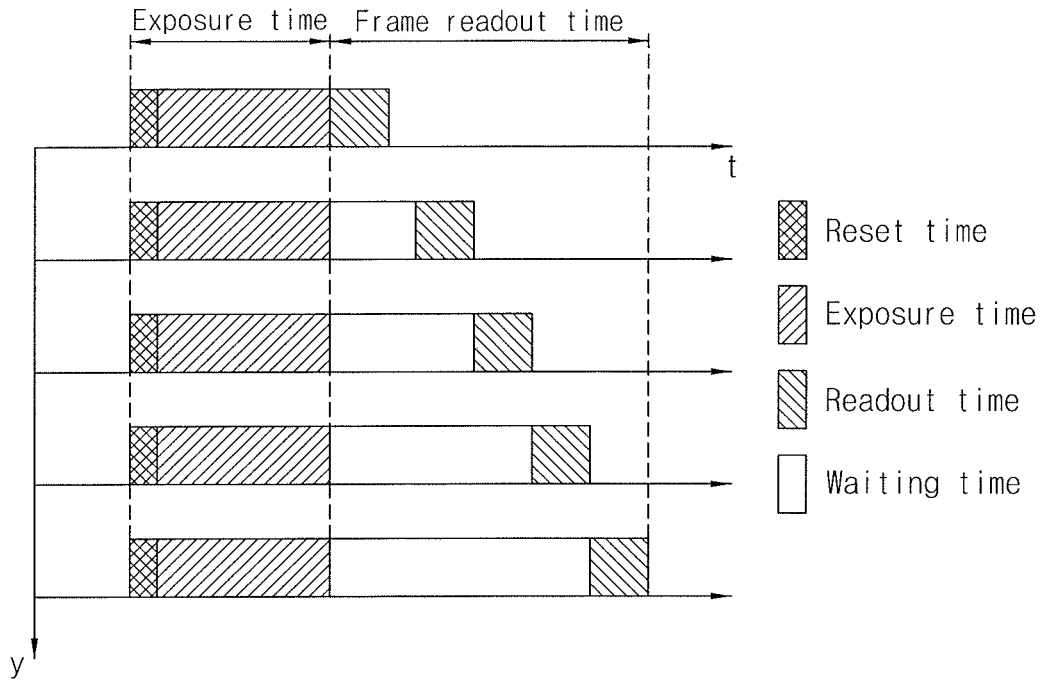
FIG. 3A illustrates a view of an operation of a global shutter mode.
Figure 3B:
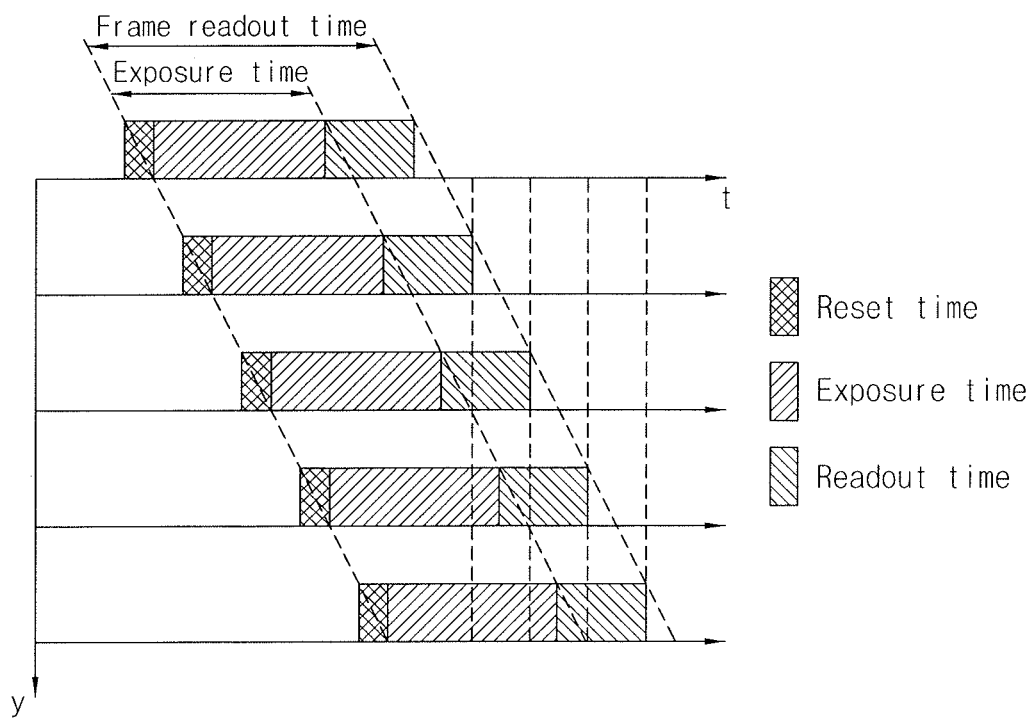
FIG. 3B illustrates a view of an operation of a rolling shutter mode.

FIG. 3A illustrates an operation of a global shutter mode. FIG. 3B illustrates an operation of a rolling shutter mode.

Referring to FIGS. 1 to 3B, the image sensor 100 may be driven in the global shutter mode and the rolling shutter mode. When the image sensor 100 is driven in the global shutter mode, as shown in FIG. 3A, an integration time of a photodiode PD may be controlled in the same manner for all pixels 112 of the pixel array 110. In other words, each pixel may be exposed simultaneously for a same exposure time. When the image sensor 100 is driven in the rolling shutter mode, as shown in FIG. 3B, the integration time of the photodiode PD is controlled differently for each row of the pixel array. In other words, the pixels are not all exposed at the same time, but the exposure is scanned along the pixels and the exposure time of pixels may partially overlap. The integration time may refer to a time during which the photodiode PD substantially accumulates photoelectrons and is related to the exposure time. Depending on example embodiments, the integration time may be the same for all rows or rows of a certain group. An operation mode of the image sensor 100 may be set by the DSP 200.

Figure 4:
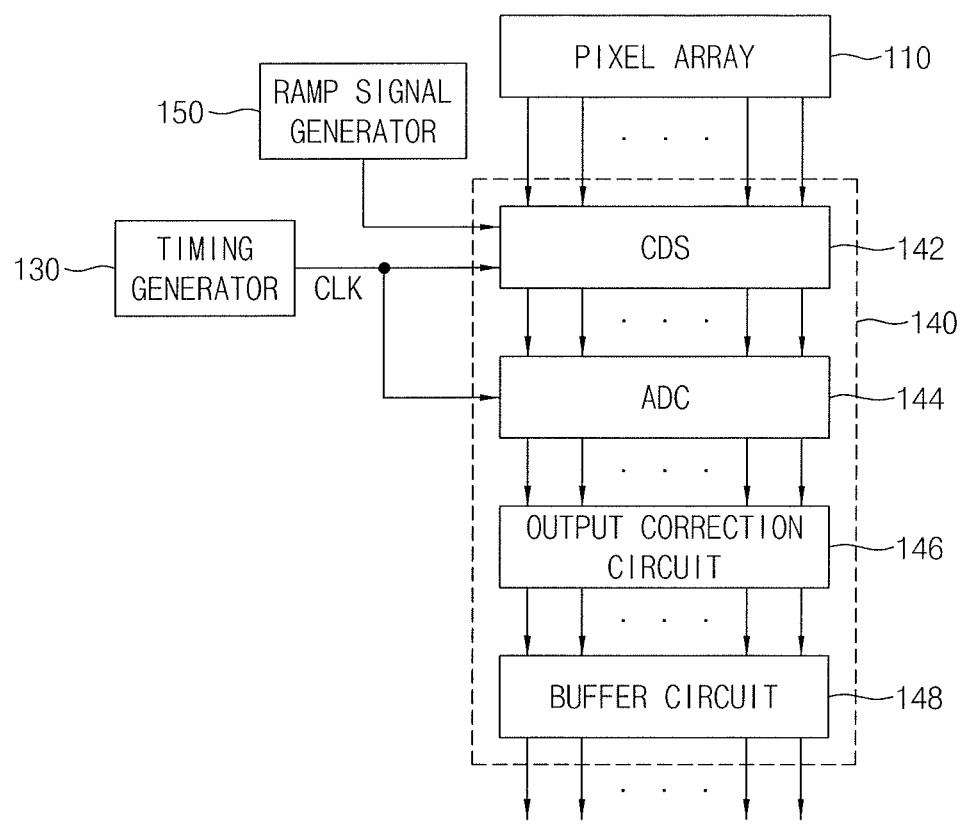
FIG. 4 illustrates a view of the readout circuit shown in FIG. 1.

FIG. 4 is a view illustrating the readout circuit shown in FIG. 1. Referring to FIGS. 1 to 4, the readout circuit 140 may include a plurality of correlated double sampling (CDS) circuits 142 (hereinafter, referred to as CDS circuits), an analog-to-digital converter (ADC) 144, an output correction circuit 146, and a buffer circuit 148.

The CDS circuit 142 may perform a CDS on each of pixel signals P1 to Pk (wherein k is a natural number) output from a plurality of column lines arranged in the pixel array 110. The CDS circuit 142 may compare (for example. compare voltage levels) a correlated double sampled pixel signal and a ramp signal RAMP output from the ramp signal generator 150 with each other. The CDS circuit 142 may output a comparison signal according to a comparison result of the correlated double sampled pixel signal and the ramp signal RAMP.

As one example, in order to output a difference between the image signal and a reset signal RST, the CDS circuit 142 may detect the difference between the image signal and the reset signal RST using the ramp signal RAMP. Further, the CDS circuit 142 may output the comparison signal according to a slope of the ramp signal RAMP. The ramp signal generator 150 may be driven on the basis of the control signal generated in the timing generator 130.

A clock CLK may be output from the timing generator 130 to the readout circuit 140. The clock CLK may be generated by a counter controller located inside a counter or inside the timing generator 130 on the basis of a counter control signal generated in the timing generator 130.

The ADC 144 may receive an analog video signal from the pixel array 110 in response to the ramp signal RAMP and a clock signal CLK_CNT received from the timing generator 130. The ADC 144 may convert the analog video signal into a digital signal on the basis of a difference between the video signal and the reset signal. The ADC 144 may convert the received video signal into the digital signal. The CDS circuit 142 may be included in the ADC 144. The ADC 144 may convert the analog signal into the digital signal using a CDS method.

The output correction circuit 146 may correct output data using a signal corresponding to a row having an optical signal and a signal corresponding to a row having no optical signal among pieces of output data of the ADC 144.

The buffer circuit 148 may latch and amplify an output signal of the output correction circuit 146 to generate the digital pixel signal (a sensor output signal of each pixel). The buffer circuit 148 may transmit the digital pixel signal to the DSP 200.

Referring to FIG. 1, the DSP 200 may include an image signal processor 210, a sensor controller 220, and an interface 230. The image signal processor 210 may control the sensor controller 220, which controls the control register block 132, and the interface 230.

As one example, the image sensor 100 and the DSP 200 may each be implemented as a chip or may be implemented as a single package, for example, a multi-chip package. As one example, the image sensor 100 and the image signal processor 210 may be implemented as a single chip.

The image signal processor 210 may process the digital pixel signals received from the buffer circuit 148 and transmit the processed image data to the interface 230. The sensor controller 220 generates various control signals for controlling the row driver 120, the timing generator 130, the readout circuit 140, and the ramp signal generator 150 under the control of the image signal processor 210. The interface 230 may output the image data processed in the image signal processor 210 to the outside. As one example, the interface 230 may output image data IDATA processed in the image signal processor 210 to a display.

As one example, the display may be implemented as a thin film transistor-liquid crystal display (TFT-LCD), a light-emitting diode (LED) display, an organic LED (OLED) display, or an active-matrix OLED (AMOLED) display.

The image processing system may be implemented as a portable electronic device. The portable electronic device may be implemented as a laptop computer, a mobile phone, a smart phone, a tablet PC, a personal digital assistant (PDA), an enterprise digital assistant (EDA), a digital still camera, a digital video camera, a portable multimedia player (PMP), a mobile internet device (MID), a wearable computer, an internet of things (IoT) device, or an internet of everything (IoE) device.

Figure 5A:
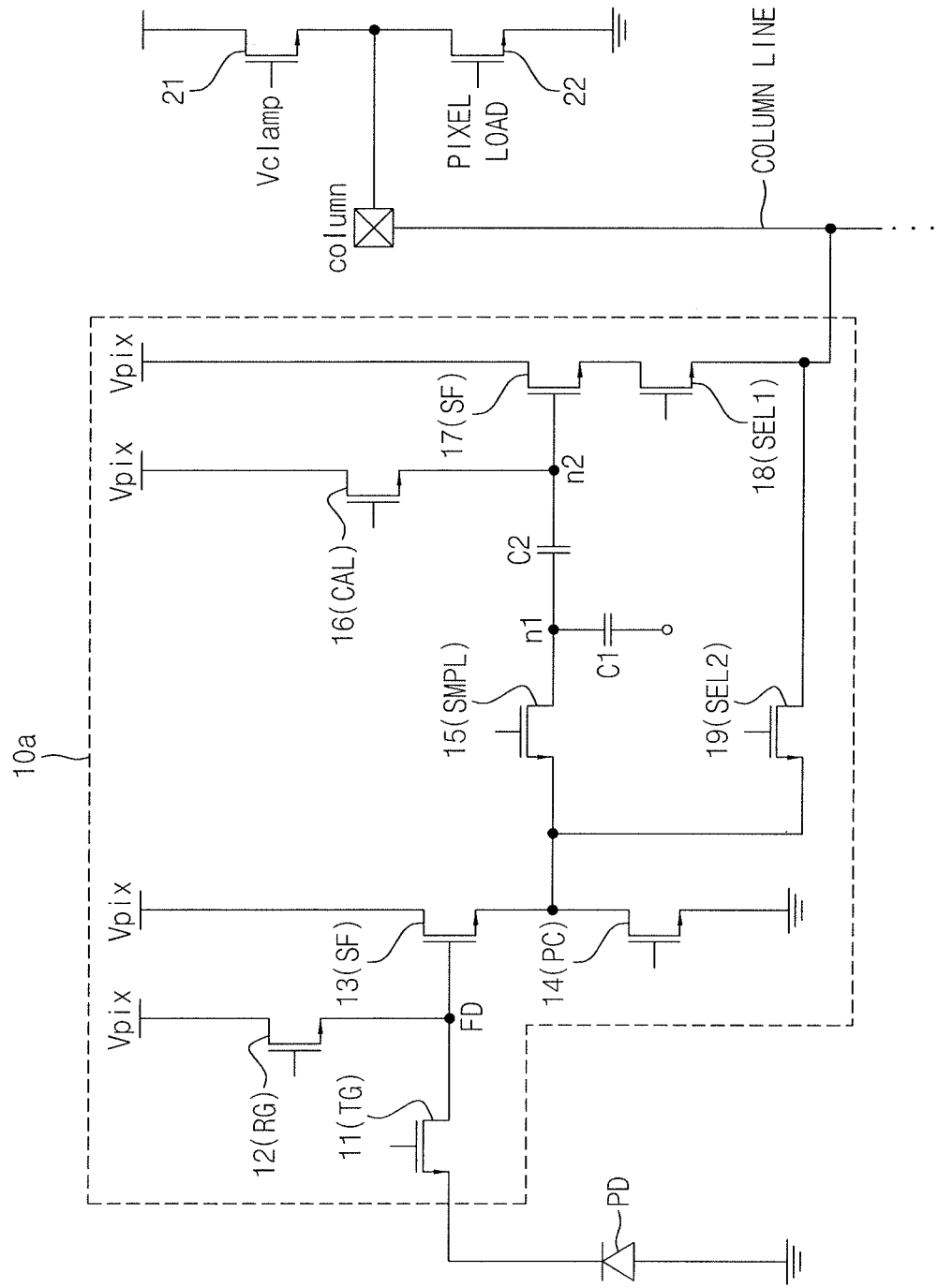
FIG. 5A illustrates a view of one example of a circuit diagram of the pixel shown in FIG. 2.
Figure 6:
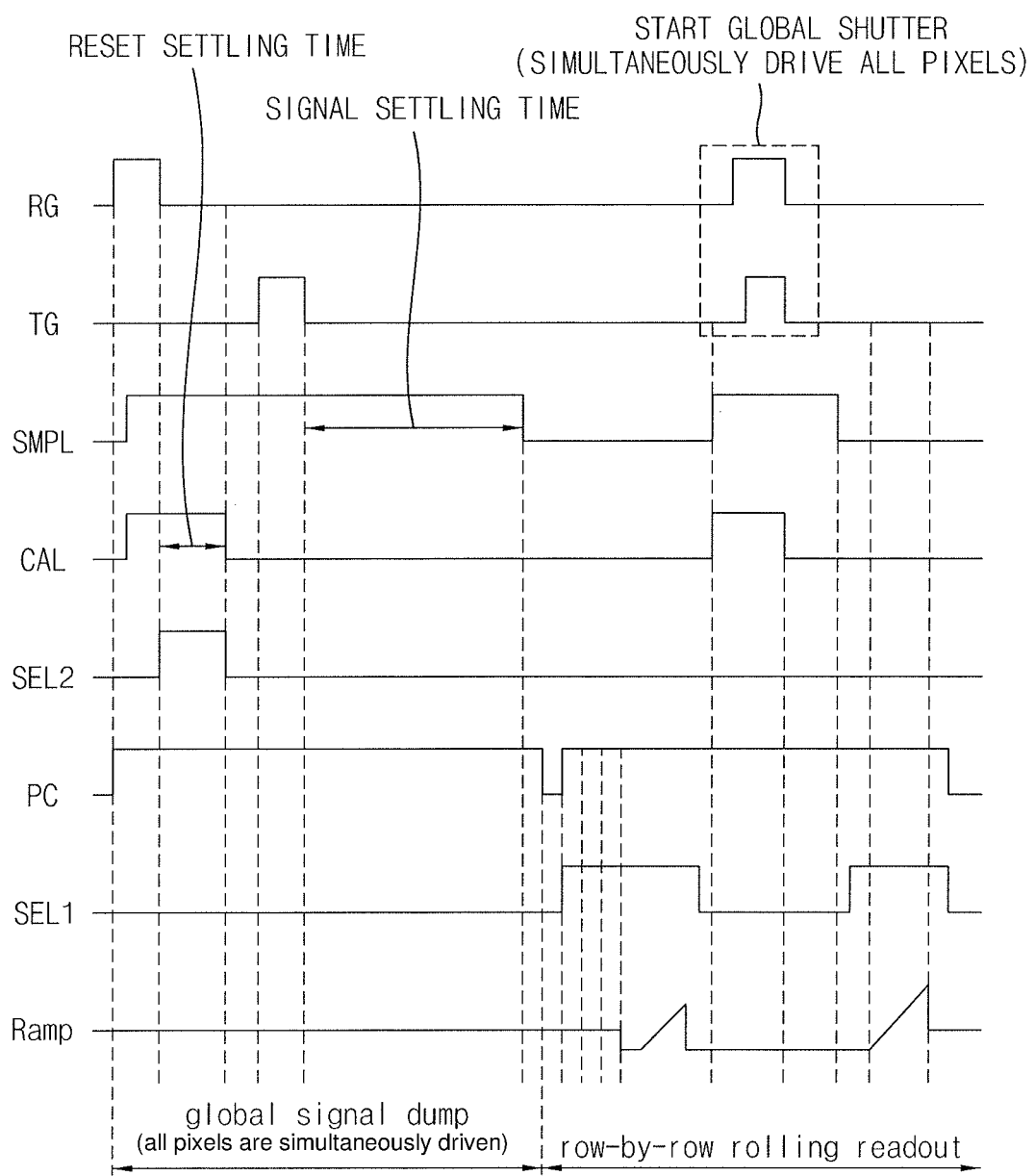
FIG. 6 illustrates a signal timing diagram of the global shutter mode.

FIG. 5A illustrates an example of a circuit diagram of the pixel shown in FIG. 2. FIG. 6 is a signal timing diagram of the global shutter mode.

Referring to FIGS. 2, 5A, and 6, control signals applied to a pixel driving circuit 10a of each pixel 112 may be generated in the row driver 120. The pixel 112 may include a photodiode PD, a plurality of transistors 11 to 19, and a plurality of capacitors C1 and C2. The photodiode PD and the plurality of transistors 11 to 19 may be formed in a P-type well (P-well) in an N-type substrate. In an implementation, the photodiode PD and the plurality of transistors 11 to 19 may be formed in an N-type well (N-well) in a P-type substrate.

The photodiode PD accumulates (or collects) photoelectrons generated in response to incident light. The photodiode PD is an example of a photoelectric conversion device and may be at least one of a photodiode, a photo transistor, a photo gate, a pinned photo diode (PPD), combinations thereof, and the like.

The plurality of transistors 11 to 19 may include a first transistor 11 (TG, transfer transistor), a second transistor 12 (RG, reset transistor), a third transistor 13 (SF, first source follow transistor), a fourth transistor 14 (PC, pre-charge transistor), a fifth transistor 15 (SMPL, sampling transistor), a sixth transistor 16 (CAL, calibration transistor), a seventh transistor 17 (SF, second source follow transistor), an eighth transistor 18 (SEL1, first selection transistor), and a ninth transistor 19 (SEL2, second selection transistor).

The first transistor 11 (TG, transfer transistor) may be between the photodiode PD and a floating diffusion node FD. The first transistor 11 (TG, transfer transistor) has a first terminal which may be connected to an output terminal of the photodiode PD and a second terminal which may be connected to the floating diffusion node FD. A transfer control signal TG may be input to a gate terminal of the first transistor 11 (TG, transfer transistor). The first transistor 11 (TG, transfer transistor) may be turned on or off on the basis of the transfer control signal TG input to the gate terminal thereof from the row driver 120.

The first transistor 11 (TG, transfer transistor) may be turned off during a reset settling time and turned on before a signal setting time. When the first transistor 11 (TG, transfer transistor) is turned on, charges output from the photodiode PD accumulate in the floating diffusion node FD. That is, when the first transistor 11 (TG, transfer transistor) is turned on, an output signal of the photodiode PD is transferred to the floating diffusion node FD.

The second transistor 12 (RG, reset transistor) may be between a pixel voltage Vpix and the floating diffusion node FD. The second transistor 12 (RG, reset transistor) has a first terminal to which the pixel voltage Vpix may be supplied and a second terminal which may be connected to the floating diffusion node FD. A reset control signal RG may be input to a gate terminal of the second transistor 12 (RG, reset transistor). The second transistor 12 (RG, reset transistor) may be turned on or off on the basis of the reset control signal RG input to the gate terminal thereof from the row driver 120.

The second transistor 12 (RG, reset transistor) may be turned on before the reset settling time and turned off during the reset settling time. The second transistor 12 (RG, reset transistor) may be maintained in an off-state during a signal settling time after the reset settling time. The second transistor 12 (RG, reset transistor) may remove the photoelectrons in the floating diffusion node FD in response to the reset control signal RG. That is, when the second transistor 12 (RG, reset transistor) is turned on, a voltage level of the floating diffusion node FD is reset to the pixel voltage Vpix.

The third transistor 13 (SF, first source follow transistor) may be between the pixel voltage Vpix, the fourth transistor 14 (PC, pre-charge transistor), and the fifth transistor 15 (SMPL, sampling transistor). In particular, the third transistor 13 (SF, first source follow transistor) has a first terminal to which the pixel voltage Vpix may be supplied and a second terminal which may be connected to the fourth transistor 14 (PC, pre-charge transistor) and the fifth transistor 15 (SMPL, sampling transistor).

The charges in the floating diffusion node FD may be input to a gate terminal of the third transistor 13 (SF, first source follow transistor). The third transistor 13 (SF, first source follow transistor) may operate on the basis of a voltage level determined according to the charges in the floating diffusion node FD. The third transistor 13 (SF, first source follow transistor) may be operated by the voltage of the floating diffusion node FD to output the charges in the floating diffusion node FD to the fourth transistor 14 (PC, pre-charge transistor), the fifth transistor 15 (SMPL, sampling transistor, and the ninth transistor 19 (SEL2, second selection transistor).

The fourth transistor 14 (PC, pre-charge transistor) may be between the third transistor 13 (SF, first source follow transistor) and a ground GND. The fourth transistor 14 (PC, pre-charge transistor) has a first terminal which may be connected to the third transistor 13 (SF, first source follow transistor) and a second terminal which may be connected to the ground GND. A pre-charge control signal PC may be input a gate terminal of the fourth transistor 14 (PC, pre-charge transistor). The fourth transistor 14 (PC, pre-charge transistor) may be turned on or off on the basis of the pre-charge control signal PC input to the gate terminal thereof from the row driver 120. When the fourth transistor 14 (PC, pre-charge transistor) is turned on, a node to which an second terminal of the third transistor 13 (SF, first source follow transistor) is connected may be pre-charged. That is, when the fourth transistor 14 (PC, pre-charge transistor) is turned on, the node to which an input terminal of the fifth transistor 15 (SMPL, sampling transistor) is pre-charged. The fourth transistor 14 (PC, pre-charge transistor) may be turned on before the reset settling time and may be maintained in an on-state until the signal settling time.

The fifth transistor 15 (SMPL, sampling transistor) may be between the third transistor 13 (SF, first source follow transistor) and the seventh transistor 17 (SF, second source follow transistor). The fifth transistor 15 (SMPL, sampling transistor) may be disposed between the fourth transistor 14 (PC, pre-charge transistor) and the sixth transistor 16 (CAL, calibration transistor). A first terminal of the fifth transistor 15 (SMPL, sampling transistor) may be connected to the second terminal of the third transistor 13 (SF, first source follow transistor) and the fourth transistor 14 (PC, pre-charge transistor). A second terminal of the fifth transistor 15 (SMPL, sampling transistor) may be connected to the sixth transistor 16 (CAL, calibration transistor) and the seventh transistor 17 (SF, second source follow transistor).

A sampling control signal sample may be input to a gate terminal of the fifth transistor 15 (SMPL, sampling transistor). The fifth transistor 15 (SMPL, sampling transistor) may be turned on or off on the basis of the sampling control signal sample input to the gate terminal thereof from the row driver 120. The fifth transistor 15 (SMPL, sampling transistor) may be turned on before the reset settling time and may be maintained in an on-state until the signal settling time. When the fifth transistor 15 (SMPL, sampling transistor) is turned on, the charges in the floating diffusion node FD are transferred to a first node n1. When the fifth transistor 15 (SMPL, sampling transistor) is turned on, the charges in a first capacitor C1 and a second capacitor C2 are sampled.

A first terminal of the first capacitor C1 may be connected to the input terminal of the fifth transistor 15 (SMPL, sampling transistor). A second terminal of the first capacitor C1 may be connected to the ground. A first terminal of the second capacitor C2 may be connected to the input terminal of the fifth transistor 15 (SMPL, sampling transistor) and the first terminal of the first capacitor C1. A second terminal of the second capacitor C2 may be connected to an second terminal of the sixth transistor 16 (CAL, calibration transistor) and a gate terminal of the seventh transistor 17 (SF, second source follow transistor).

The first node n1 may be between a second terminal of the fifth transistor 15 (SMPL, sampling transistor) and the gate terminal of the seventh transistor 17 (SF, second source follow transistor). A second node n2 may be between the second terminal of the sixth transistor 16 (CAL, calibration transistor) and the gate terminal of the seventh transistor 17 (SF, second source follow transistor).

The sixth transistor 16 (CAL, calibration transistor) may be between the pixel voltage Vpix and the second node n2, e.g., between the fifth transistor 15 (SMPL, sampling transistor) and the seventh transistor 17 (SF, second source follow transistor). The pixel voltage Vpix may be supplied to a first terminal of the sixth transistor 16 (CAL, calibration transistor). The first terminal of the sixth transistor 16 (CAL, calibration transistor) may be connected to the seventh transistor 17 (SF, second source follow transistor). A calibration control signal Cal may be input to a gate terminal of the sixth transistor 16 (CAL, calibration transistor). The sixth transistor 16 (CAL, calibration transistor) may be turned on or off on the basis of the calibration control signal Cal input to the gate terminal thereof from the row driver 120. When the sixth transistor 16 (CAL, calibration transistor) is turned on, the pixel voltage Vpix is transferred to the second node n2.

The seventh transistor 17 (SF, second source follow transistor) may be between the pixel voltage Vpix and the eighth transistor 18 (SEL1, first selection transistor). The gate terminal of the seventh transistor 17 (SF, second source follow transistor) may be connected to the second node n2. The pixel voltage Vpix may be supplied to a first terminal of the seventh transistor 17 (SF, second source follow transistor). A second terminal of the seventh transistor 17 (SF, second source follow transistor) may be connected to the eighth transistor 18 (SEL1, first selection transistor). The seventh transistor 17 (SF, second source follow transistor) may operate on the basis of a voltage level determined according to charges in the second node n2.

The eighth transistor 18 (SEL1, first selection transistor) may be between the seventh transistor 17 (SF, second source follow transistor) and the column line. The eighth transistor 18 (SEL1, first selection transistor) has a first terminal which may be connected to the seventh transistor 17 (SF, second source follow transistor) and a second terminal which may be connected to the column line. A first selection control signal Sel 1 may be input to a gate terminal of the eighth transistor 18 (SEL1, first selection transistor). The eighth transistor 18 (SEL1, first selection transistor) may be turned on or off on the basis of the first selection control signal Sel 1 input to the gate terminal thereof from the row driver 120. When the eighth transistor 18 (SEL1, first selection transistor) is turned on, an output signal (as one example, an analog pixel signal) of the seventh transistor 17 (SF, second source follow transistor) is output to the column line.

The ninth transistor 19 (SEL2, second selection transistor) may be between the second terminal of the third transistor 13 (SF, first source follow transistor) and the column line. A first terminal of the ninth transistor 19 (SEL2, second selection transistor) may be connected to the second terminal of the third transistor 13 (SF, first source follow transistor) and the first terminal of the fifth transistor 15 (SMPL, sampling transistor). A second terminal of the ninth transistor 19 (SEL2, second selection transistor) may be connected to the column line. A second selection control signal Sel 2 may be input to a gate terminal of the ninth transistor 19 (SEL2, second selection transistor). The ninth transistor 19 (SEL2, second selection transistor) may be turned on or off on the basis of the second selection control signal Sel 2 input to the gate terminal thereof from the row driver 120.

In the global shutter mode, the ninth transistor 19 (SEL2, second selection transistor) may be maintained in an on-state during a reset settling time on the basis of the second selection control signal Sel 2. In the global shutter mode, the ninth transistor 19 (SEL2, second selection transistor) may be maintained in an off-state after the reset settling time on the basis of the second selection control signal Sel 2. The ninth transistor 19 (SEL2, second selection transistor) may be connected to a clamping transistor 21 (Vclamp) and a pixel transistor 22, one of each of which is provided in each column line.

As one example, when the ninth transistor 19 (SEL2, second selection transistor) is turned on, an output signal of the third transistor 13 (SF, first source follow transistor) may be output to the column line. The ninth transistor 19 (SEL2, second selection transistor) may maintain an output of the third transistor 13 (SF, first source follow transistor) at or above a predetermined voltage. An output node of the third transistor 13 (SF, first source follow transistor) may be clamped by the ninth transistor 19 (SEL2, second selection transistor) so that the output of the third transistor 13 (SF, first source follow transistor) may be maintained at or above the predetermined voltage. The output node of the third transistor 13 (SF, first source follow transistor) may be bypassed to the column line by the ninth transistor 19 (SEL2, second selection transistor) so that the output of the third transistor 13 (SF, first source follow transistor) may be maintained at or above a predetermined voltage.

Figure 5B:
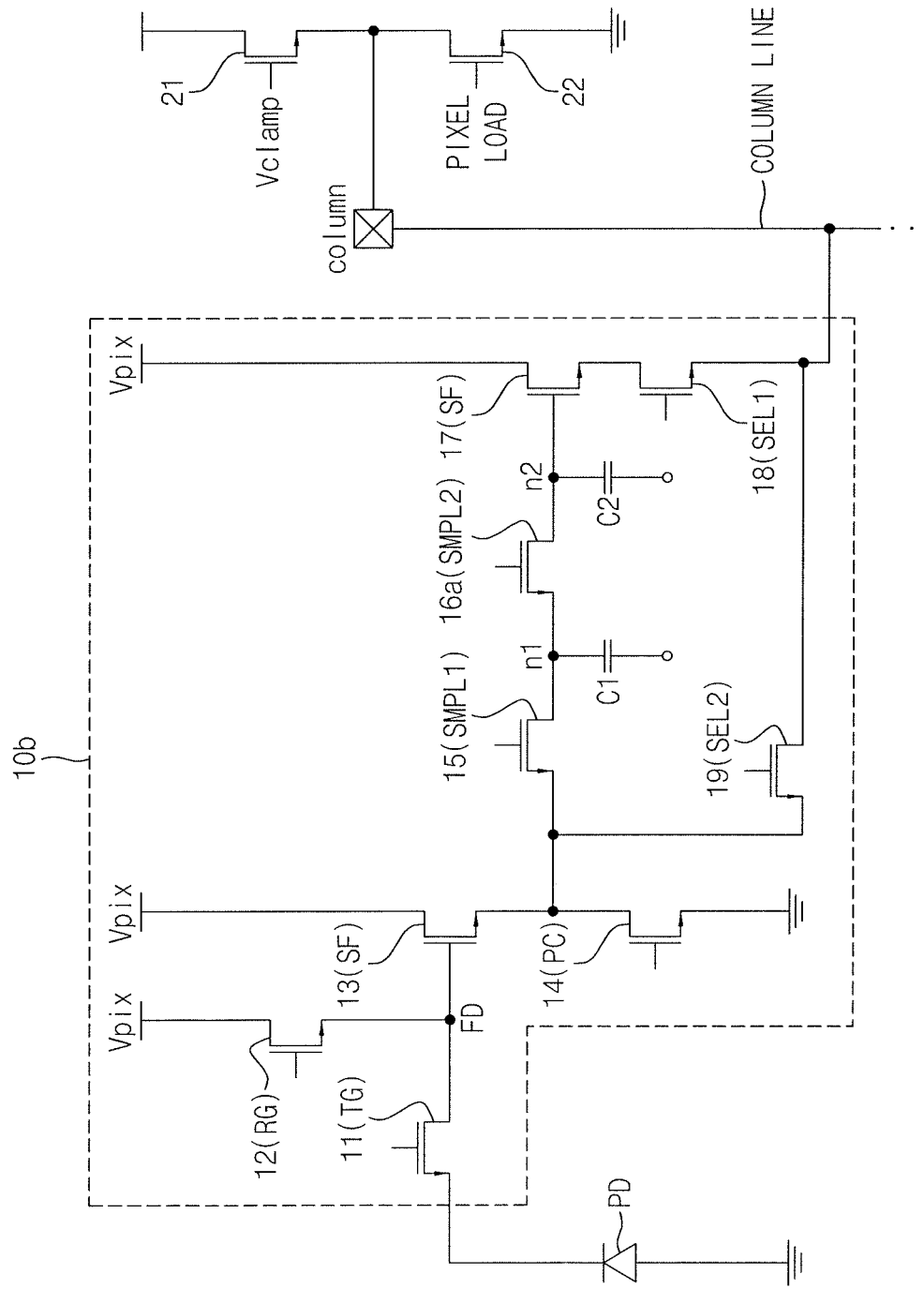
FIG. 5B illustrates a view of one example of a circuit diagram of the pixel shown in FIG. 2.

FIG. 5B illustrates another example of a circuit diagram of the pixel shown in FIG. 2. A pixel driving circuit 10b shown in FIG. 5B is the same as the pixel driving circuit 10a shown in FIG. 5A except for a sixth transistor 16a (SMPL2, second sampling transistor) and a second capacitor C2a. The detailed descriptions of other components except for the sixth transistor 16a (SMPL2, second sampling transistor) and the second capacitor C2 may be omitted. Referring to FIGS. 2, 5B, and 6, control signals applied to the pixel driving circuit 10b of each pixel 112 may be generated in the row driver 120. The pixel 112 may include a photodiode PD, a plurality of transistors 11 to 19, and a plurality of capacitors C1 and C2a.

The plurality of transistors 11 to 19 may include the first transistor 11 (TG, transfer transistor), the second transistor 12 (RG, reset transistor), the third transistor 13 (SF, first source follow transistor), the fourth transistor 14 (PC, pre-charge transistor), a fifth transistor 15 (SMPL1, first sampling transistor), the sixth transistor 16a (SMPL2, second sampling transistor), the seventh transistor 17 (SF, second source follow transistor), an eighth transistor 18 (SEL1, first selection transistor), and the ninth transistor 19 (SEL2, second selection transistor).

The first transistor 11 (TG, transfer transistor) may be turned on or off on the basis of a transfer control signal TG input to a gate terminal thereof from the row driver 120. The first transistor II (TG, transfer transistor) may be turned off during a reset settling time and turned on before a signal setting time. When the first transistor 11 (TG, transfer transistor) is turned on, charges output from the photodiode PD are accumulated in a floating diffusion node FD.

The second transistor 12 (RG, reset transistor) may be turned on or off on the basis of the reset control signal RG input to a gate terminal thereof from the row driver 120. The second transistor 12 (RG, reset transistor) may be turned on before the reset settling time and turned off during the reset settling time. The second transistor 12 (RG, reset transistor) may be maintained in an off-state during the signal settling time after the reset settling time. The second transistor 12 (RG, reset transistor) may remove the photoelectrons in the floating diffusion node FD in response to the reset control signal RG.

The third transistor 13 (SF, first source follow transistor) may operate on the basis of a voltage level determined according to the charges in the floating diffusion node FD. The third transistor 13 (SF, first source follow transistor) may be operated by the voltage of the floating diffusion node FD to output the charges in the floating diffusion node FD to the fourth transistor 14 (PC, pre-charge transistor) and the ninth transistor 19 (SEL2, second selection transistor).

The fourth transistor 14 (PC, pre-charge transistor) may be turned on or off on the basis of a pre-charge control signal PC input to a gate terminal thereof from the row driver 120. When the fourth transistor 14 (PC, pre-charge transistor) is turned on, a node to which the second terminal of the third transistor 13 (SF, first source follow transistor) is connected is pre-charged. The fourth transistor 14 (PC, pre-charge transistor) may be turned on before the reset settling time and may be maintained in an on-state through the signal settling time.

The fifth transistor 15 (SMPL1, first sampling transistor) may be between the third transistor 13 (SF, first source follow transistor) and the seventh transistor 17 (SF, second source follow transistor). The fifth transistor 15 (SMPL1, first sampling transistor) may be between the fourth transistor 14 (PC, pre-charge transistor) and the sixth transistor 16 (CAL, calibration transistor). A first terminal of the fifth transistor 15 (SMPL1, first sampling transistor) may be connected to the second terminal of the third transistor 13 (SF, first source follow transistor) and the fourth transistor 14 (PC, pre-charge transistor). A second terminal of the fifth transistor 15 (SMPL1, first sampling transistor) may be connected to the sixth transistor 16a (SMPL2, second sampling transistor) and the seventh transistor 17 (SF, second source follow transistor).

The fifth transistor 15 (SMPL1, first sampling transistor) may be turned on or off on the basis of a sampling control signal sample input to a gate terminal thereof from the row driver 120. The fifth transistor 15 (SMPL1, first sampling transistor) may be turned on before the reset settling time and maintained in an on-state until the signal settling time. When the fifth transistor 15 (SMPL1, first sampling transistor) is turned on, the charges in the floating diffusion node FD are transferred to a first node n1. When the fifth transistor 15 (SMPL1 first sampling transistor) is turned on, the charges in the first capacitor C1 are sampled.

The first terminal of the first capacitor C1 may be connected to the second terminal of the fifth transistor 15 (SMPL1, first sampling transistor). The second terminal of the first capacitor C1 may be connected to the ground.

The sixth transistor 16a (SMPL2, second sampling transistor) may be turned on or off on the basis of a sampling control signal sample input to a gate terminal thereof from the row driver 120. The sixth transistor 16a (SMPL2, second sampling transistor) may be turned on before the reset settling time and maintained in an on-state until the signal settling time. When the sixth transistor 16a (SMPL2, second sampling transistor) is turned on, charges in the first node n1 are transferred to a second node n2. When the sixth transistor 16a (SMPL2, second sampling transistor) is turned on, the charges in the second capacitor C2a are sampled.

A first terminal of the second capacitor C2a may be connected to an input terminal of the sixth transistor 16a (SMPL2, second sampling transistor). A second terminal of the second capacitor C2a may be connected to the ground.

The first node n1 may be between the second terminal of the fifth transistor 15 (SMPL1, first sampling transistor) and a gate terminal of the seventh transistor 17 (SF, second source follow transistor). The second node n2 may be between the second terminal of the sixth transistor 16a (SMPL2, second sampling transistor) and the ground.

The seventh transistor 17 (SF, second source follow transistor) may be between the pixel voltage Vpix and the eighth transistor 18 (SEL1, first selection transistor). The gate terminal of the seventh transistor 17 (SF, second source follow transistor) may be connected to the second node n2. The pixel voltage Vpix may be supplied to the first terminal of the seventh transistor 17 (SF, second source follow transistor). The second terminal of the seventh transistor 17 (SF, second source follow transistor) may be connected to the eighth transistor 18 (SEL1, first selection transistor). The seventh transistor 17 (SF, second source follow transistor) may operate on the basis of a voltage level determined according to charges in the second node n2.

The eighth transistor 18 (SEL1, first selection transistor) may be turned on or off on the basis of a first selection control signal Sel 1 input to a gate terminal thereof from the row driver 120. When the eighth transistor 18 (SEL1, first selection transistor) is turned on, an output signal (as one example, an analog pixel signal) of the seventh transistor 17 (SF, second source follow transistor) is output to the column line.

The ninth transistor 19 (SEL2, second selection transistor) may be between the second terminal of the third transistor 13 (SF, first source follow transistor) and the column line. The first terminal of the ninth transistor 19 (SEL2, second selection transistor) may be connected to the second terminal of the third transistor 13 (SF, first source follow transistor) and the first terminal of the fifth transistor 15 (SMPL, sampling transistor). The second terminal of the ninth transistor 19 (SEL2, second selection transistor) may be connected to the column line. The second selection control signal Sel 2 may be input to a gate terminal of the ninth transistor 19 (SEL2, second selection transistor). The ninth transistor 19 (SEL2, second selection transistor) may be turned on or off on the basis of the second selection control signal Sel 2 input to a gate terminal thereof from the row driver 120.

In the global shutter mode, the ninth transistor 19 (SEL2, second selection transistor) may be maintained in an on-state during a reset settling time on the basis of the second selection control signal Sel 2. In the global shutter mode, the ninth transistor 19 (SEL2, second selection transistor) may be maintained in an off-state after the reset settling time on the basis of the second selection control signal Sel 2. The ninth transistor 19 (SEL2, second selection transistor) may be connected to the clamping transistor 21 (Vclamp) and the pixel transistor 22, one of each of which is provided in each column line.

As one example, when the ninth transistor 19 (SEL2, second selection transistor) is turned on, an output signal of the third transistor 13 (SF, first source follow transistor) is output to the column line. The ninth transistor 19 (SEL2, second selection transistor) may maintain an output of the third transistor 13 (SF, first source follow transistor) at or above the predetermined voltage. An output node of the third transistor 13 (SF, first source follow transistor) may be clamped by the ninth transistor 19 (SEL2, second selection transistor) so that the output of the third transistor 13 (SF, first source follow transistor) may be maintained at or above the predetermined voltage. An output node of the third transistor 13 (SF, first source follow transistor) may be bypassed to the column line by the ninth transistor 19 (SEL2, second selection transistor) so that the output of the third transistor 13 (SF, first source follow transistor) may be maintained at or above the predetermined voltage.

FIGS. 5C to 5G illustrate different examples in which the photodiode, the pixel driving circuit, and the clamping transistor 21 and the pixel transistor 22 shown in FIG. 5A are distributed over a plurality of substrates. In particular, the photodiode PD and the pixel driving circuit provided in each pixel 112 of the image sensor 100, and the clamping transistor 21 and the pixel transistor 22, one of each of which is provided in each column line may be distributed over a plurality of substrates, e.g., two or three substrates. For example, the clamping transistor 21 and the pixel transistor 22 may be on a first substrate (for example, a lower substrate). The photodiode and the pixel driving circuit may be distributed over one or more substrates that are vertically stacked on the first substrate. All of the vertically stacked substrates may be electrically connected to each other.

Figure 5C:
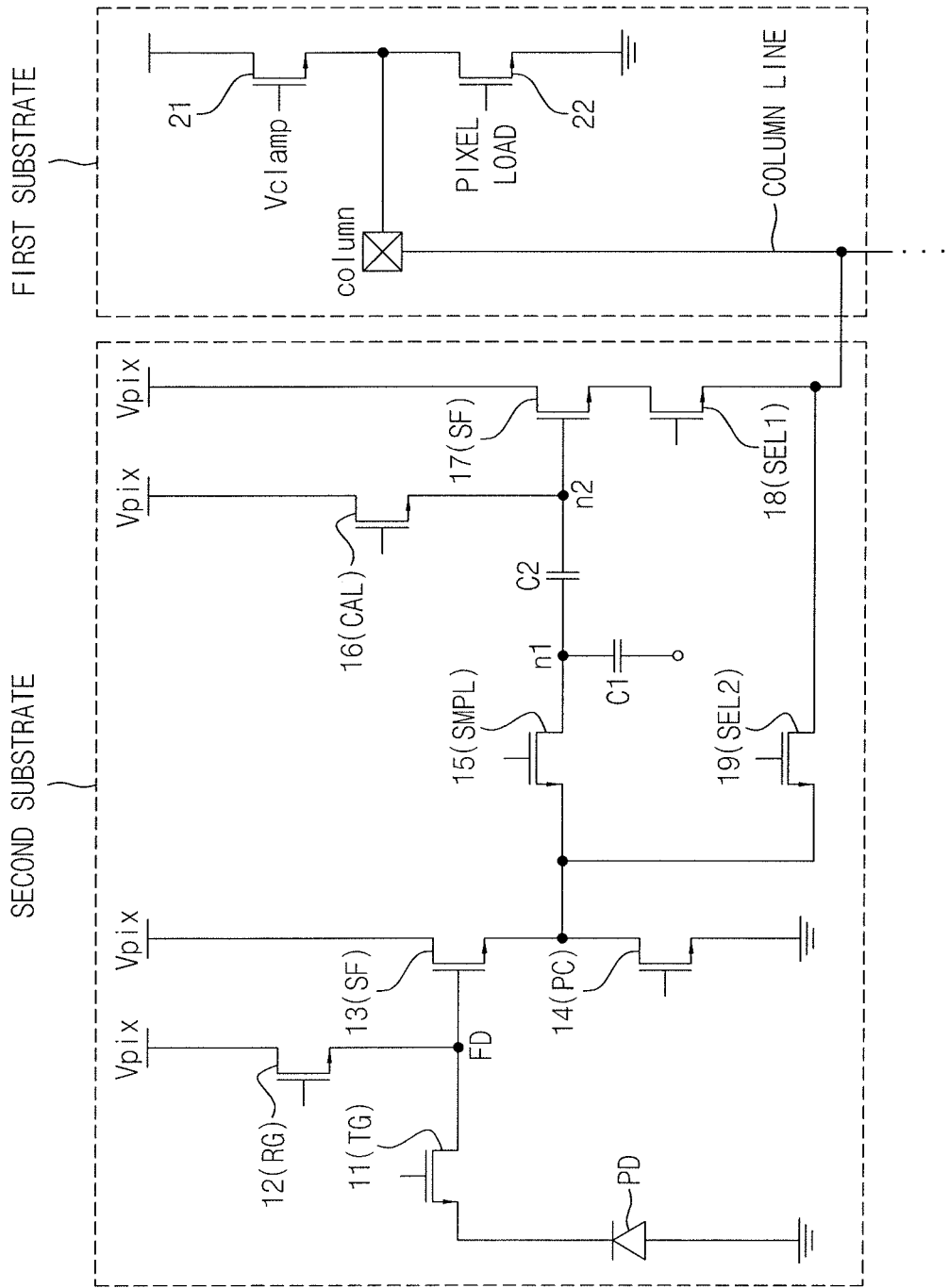
FIGS. 5C to 5G illustrate different examples in which the photodiode and the pixel driving circuit shown in FIG. 5A are distributed on a plurality of substrates.

As shown in FIG. 5C, the photodiode PD, the plurality of transistors 11 to 19 and the plurality of capacitors C1 and C2 may be all on a second substrate (for example, an upper substrate).

Figure 5D:
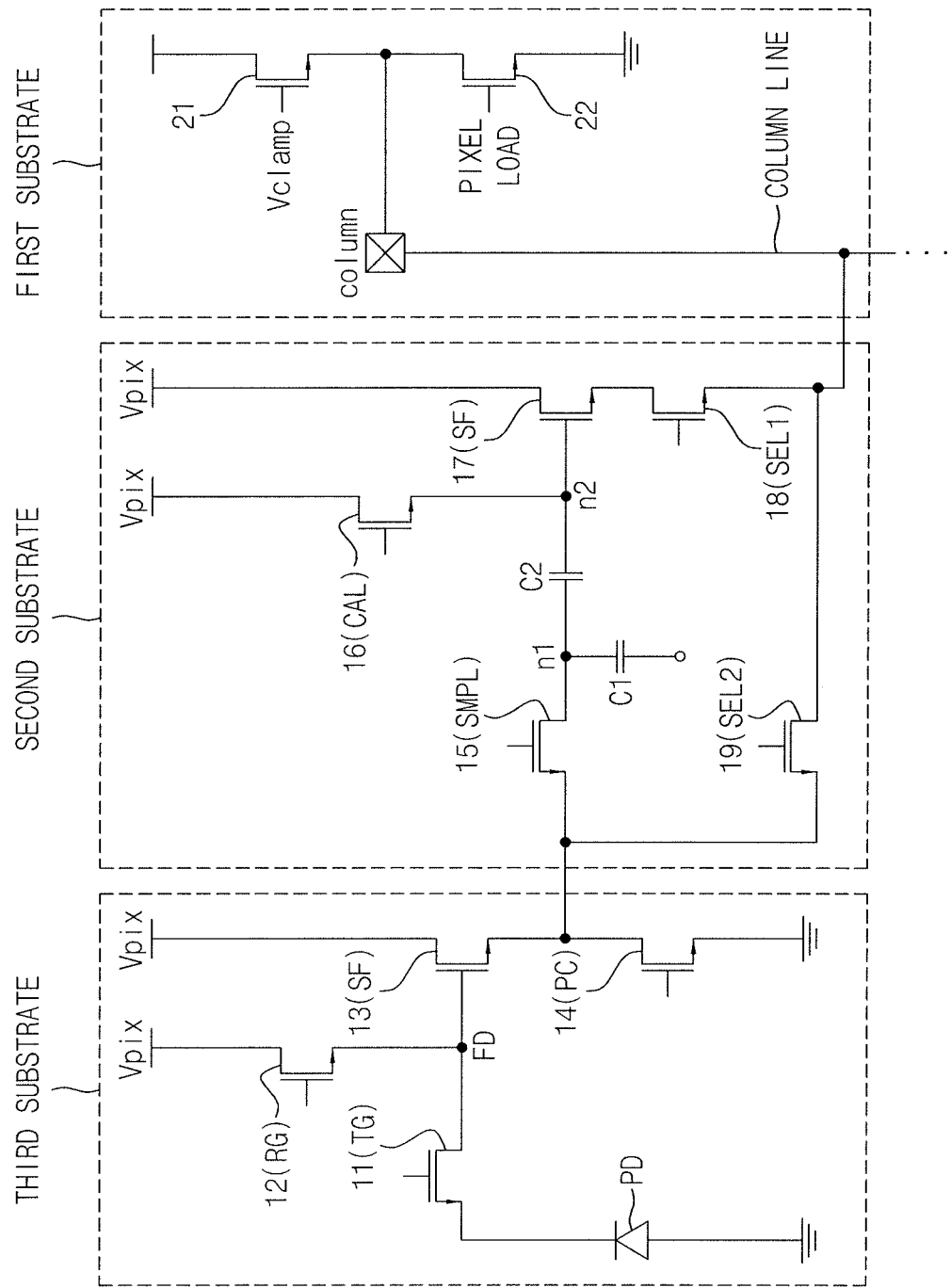

As shown in FIG. 5D, the fifth transistor 15 (SMPL, sampling transistor), the sixth transistor 16 (CAL, calibration transistor), the seventh transistor 17 (SF, second source follow transistor), the eighth transistor 18 (SEL1, first selection transistor), the ninth transistor 19 (SEL2, second selection transistor), the first capacitor C1, and the second capacitor C2 of the pixel driving circuit may be on a second substrate (for example, an intermediate substrate). The first transistor 11 (TG, transfer transistor), the second transistor 12 (RG, reset transistor), the third transistor 13 (SF, first source follow transistor), the fourth transistor 14 (PC, pre-charge transistor), and the photodiode PD of the pixel driving circuit may be on a third substrate (for example, an upper substrate).

Figure 5E:
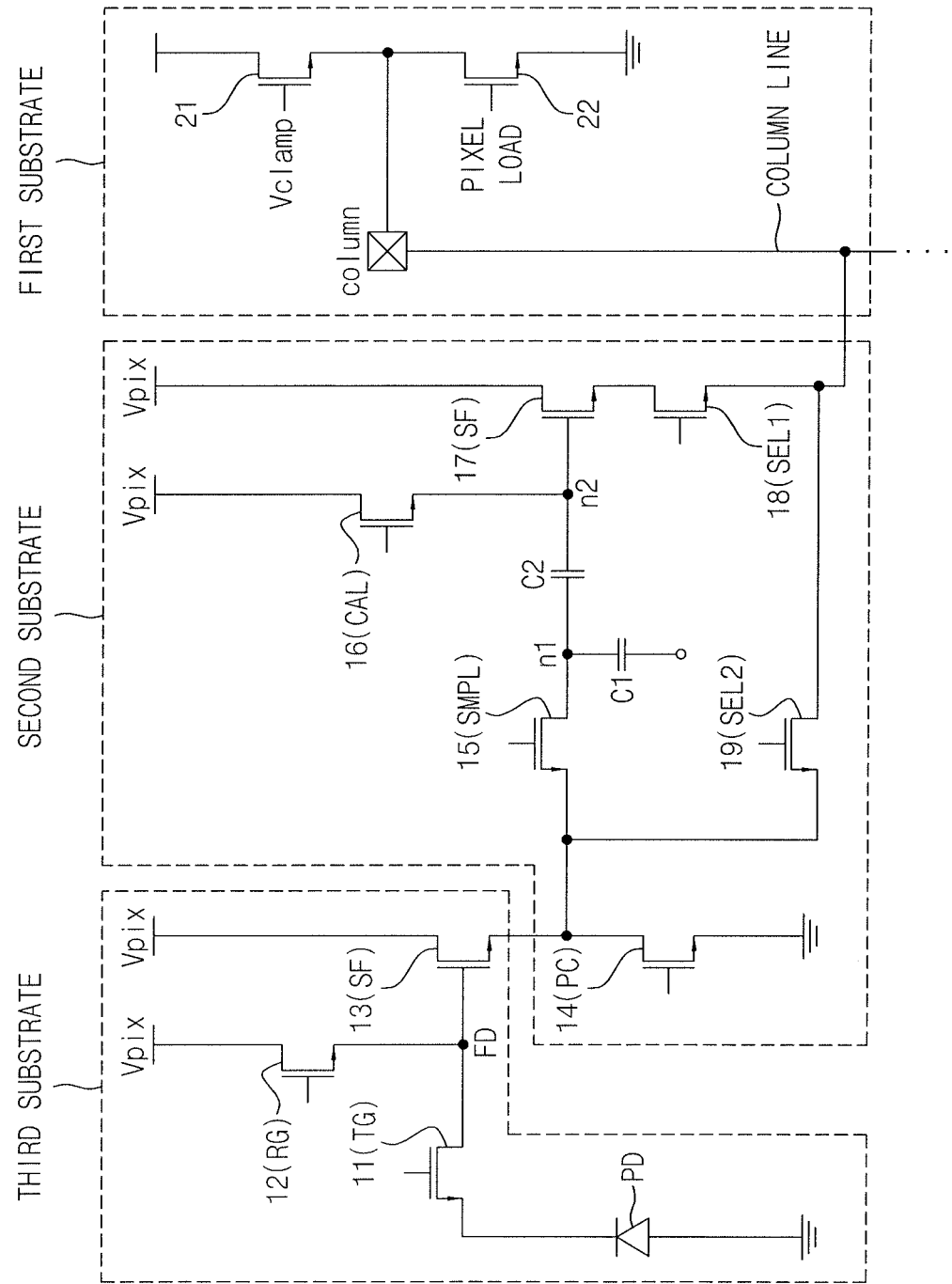

As shown in FIG. 5E, the fourth transistor 14 (PC, pre-charge transistor), the fifth transistor 15 (SMPL, sampling transistor), the sixth transistor 16 (CAL, calibration transistor), the seventh transistor 17 (SF, second source follow transistor), the eighth transistor 18 (SEL1, first selection transistor), the ninth transistor 19 (SEL2, second selection transistor), the first capacitor C1, and the second capacitor C2 of the pixel driving circuit may be on a second substrate (for example, an intermediate substrate). The first transistor 11 (TG, transfer transistor), the second transistor 12 (RG, reset transistor), the third transistor 13 (SF, first source follow transistor), and the photodiode PD of the pixel driving circuit may be on a third substrate (for example, an upper substrate).

Figure 5F:
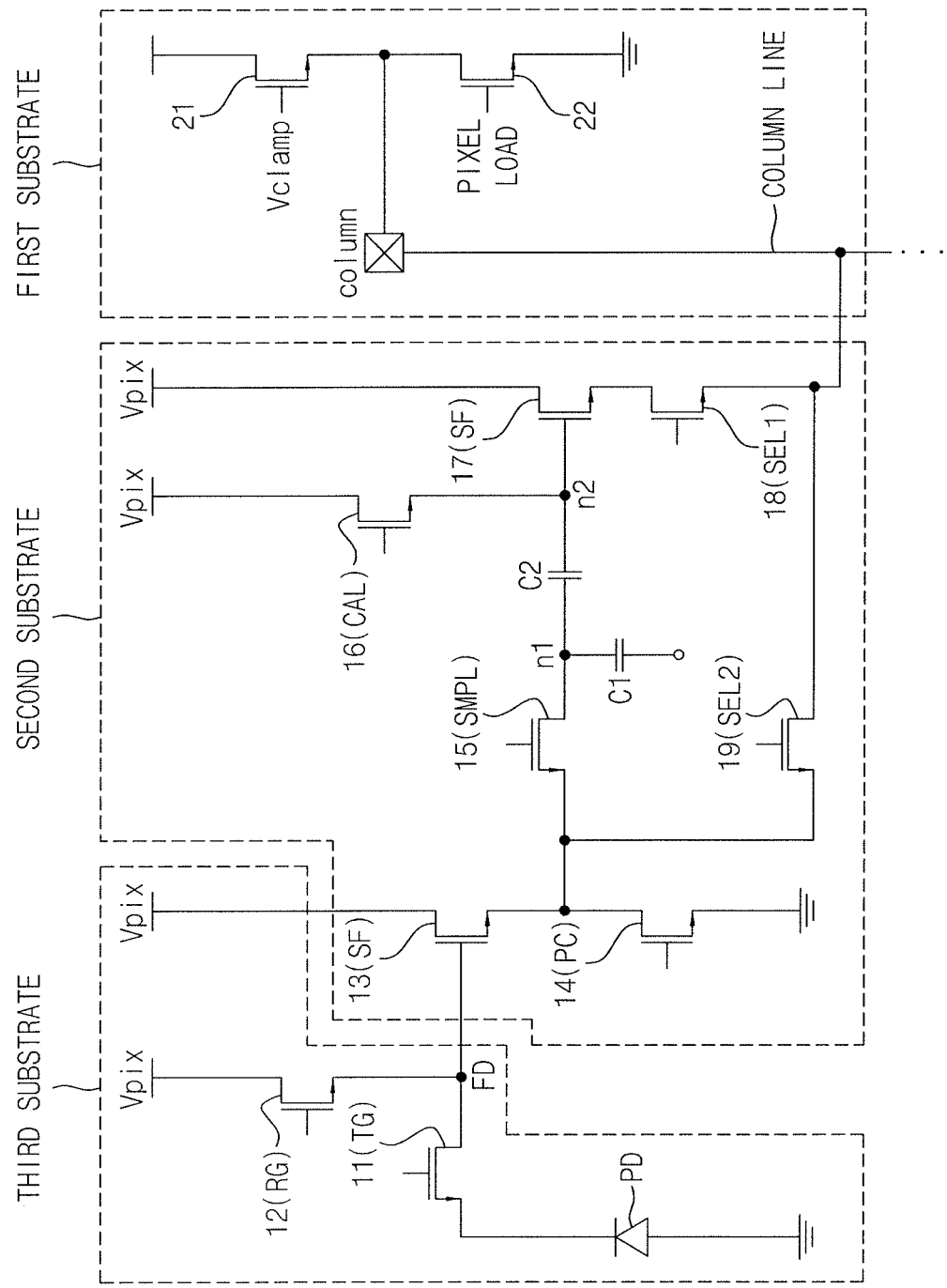

As shown in FIG. 5F, the third transistor 13 (SF, first source follow transistor), the fourth transistor 14 (PC, pre-charge transistor), the fifth transistor 15 (SMPL, sampling transistor), the sixth transistor 16 (CAL, calibration transistor), the seventh transistor 17 (SF, second source follow transistor), the eighth transistor 18 (SEL1, first selection transistor), the ninth transistor 19 (SEL2, second selection transistor), the first capacitor C1, and the second capacitor C2 of the pixel driving circuit may be on a second substrate (for example, an intermediate substrate). The first transistor 11 (TG, transfer transistor), the second transistor 12 (RG, reset transistor), and the photodiode PD of the pixel driving circuit may be disposed on a third substrate (for example, an upper substrate).

Figure 5G:
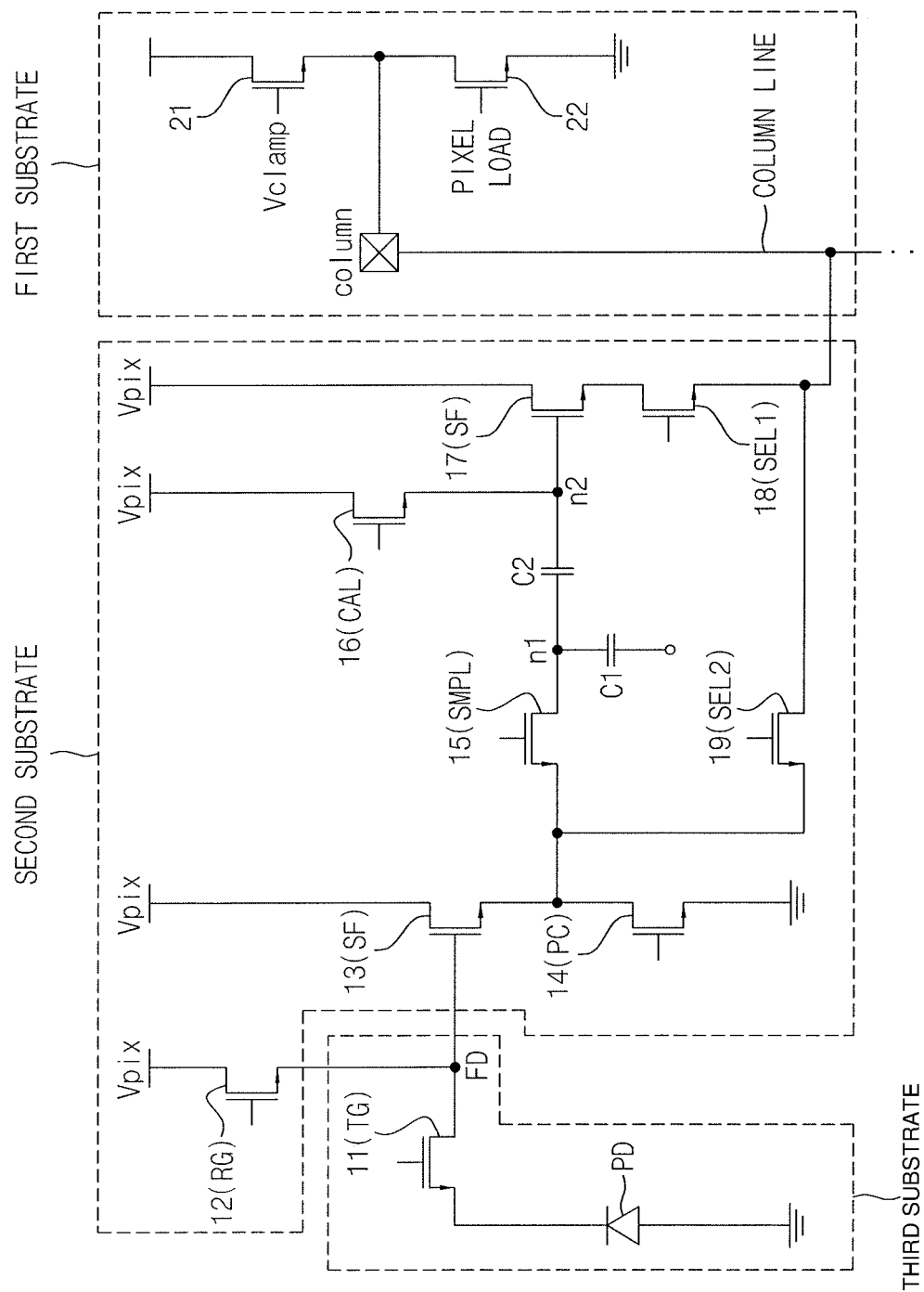

As shown in FIG. 5G, the second transistor 12 (RG, reset transistor), the third transistor 13 (SF, first source follow transistor), the fourth transistor 14 (PC, pre-charge transistor), the fifth transistor 15 (SMPL, sampling transistor), the sixth transistor 16 (CAL, calibration transistor), the seventh transistor 17 (SF, second source follow transistor), the eighth transistor 18 (SEL1, first selection transistor), the ninth transistor 19 (SEL2, second selection transistor), the first capacitor C1, and the second capacitor C2 of the pixel driving circuit may be on a second substrate (for example, an intermediate substrate). The first transistor 11 (TG, transfer transistor) and the photodiode PD of the pixel driving circuit may be on a third substrate (for example, an upper substrate).

Figure 7:
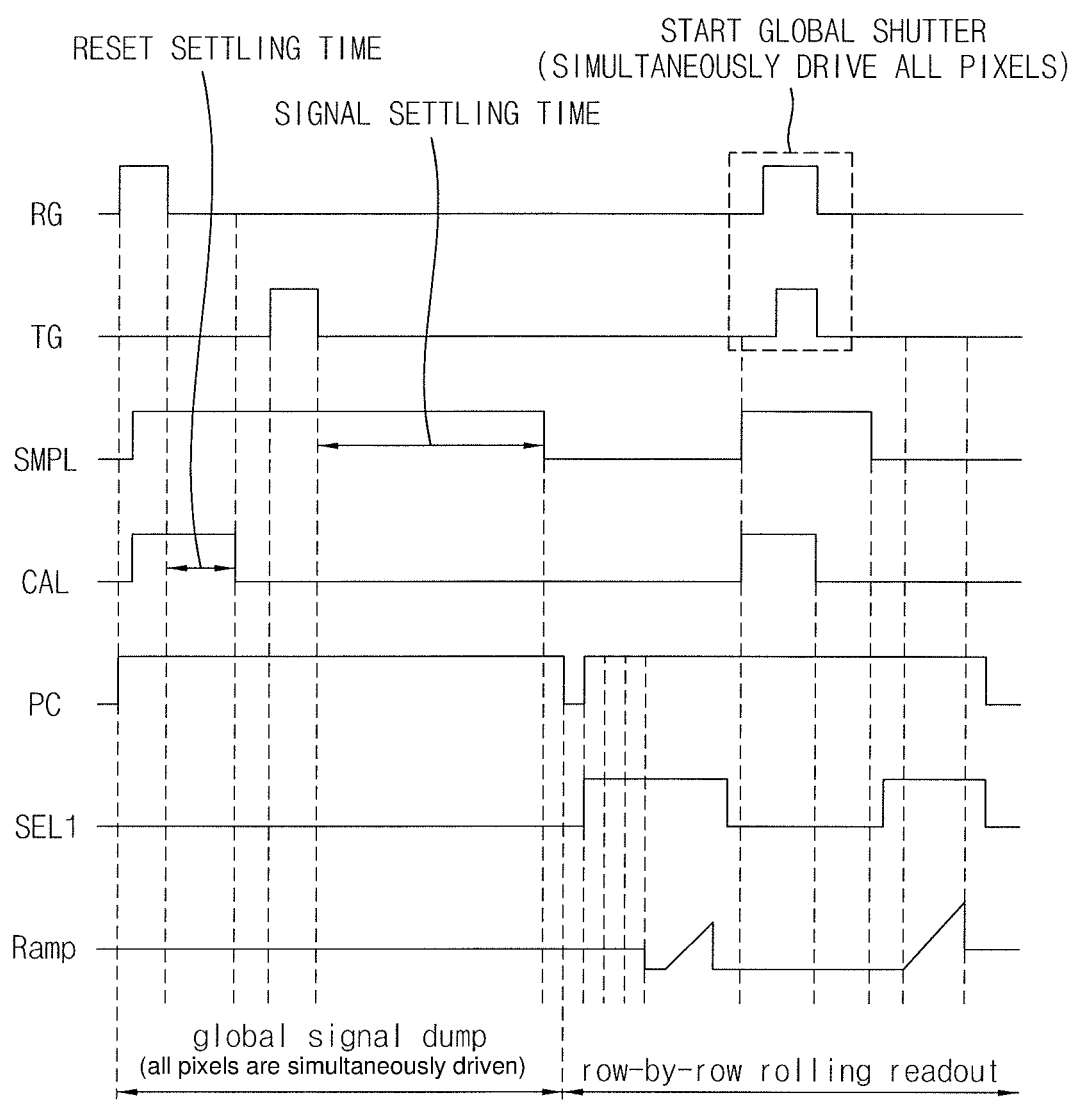
FIG. 7 illustrates a signal timing diagram for describing how a sun spot occurs in the global shutter mode.

FIG. 7 is a diagram for describing a cause for which a sun spot occurs in the global shutter mode. Referring to FIGS. 5A and 7, when the pixel driving circuit is formed by eight transistors (8Tr) without the ninth transistor 19 (SEL2, second selection transistor), a sun spot (or, a black sun) resulting from over exposure may be generated in the global shutter mode.

As one example, the photodiode PD may be reset through floating diffusion prior to integration (frame capturing). Frame capturing may be started after the photodiode PD is reset. The floating diffusion node FD may be reset after the integration. Here, thermal or kTC noise is generated, and a reset value including the kTC noise may be sampled in the first capacitor C1 and the second capacitor C2. When a sun spot is not generated, the reset value is VDD-Vth, RG. On the other hand, when a sun spot is generated, the reset value may have a zero voltage or a value similar to the zero voltage. After the reset value is sampled in the first capacitor C1 and the second capacitor C2, the sixth transistor 16 (CAL, calibration transistor) may be turned off. When the sixth transistor 16 (CAL, calibration transistor) is turned off, the second node n2 may be floating. Thereafter, the first transistor 11 (TG, transfer transistor) is toggled, and the charges may be transferred to the floating diffusion node FD. Here, the signal value may be sampled in the first capacitor C1. Accordingly, the voltage of the first node n1 may be changed, and the voltage of the second node n2 may also be changed.

When the first transistor 11 (TG) is turned off and the photodiode PD is exposed to a bright light, e.g., the sun, charges in the photodiode PD overflow so that the charges are accumulated in the floating diffusion node. Further, when the first transistor 11 (TG) is turned off and the photodiode PD is exposed to a bright light, the photodiode PD may be charged by the FD junction.

When the sun spot is generated, the voltages of the first node n1 and the second node n2 are not changed due to the charge overflowing or the charges generated by the PD junction during the reset settling time. That is, during the reset settling time, the first node n1 has a zero voltage or a voltage value similar to the zero voltage. As a result, a CDS operation is performed inside each pixel, and a reset signal value may be transferred to the second node. A double readout is required to remove a fixed pattern noise (FPN) caused by the variation of a threshold voltage Vth of the seventh transistor 17 (SF, second source follow transistor).

Referring to FIGS. 5A and 6, in the global shutter mode, the ninth transistor 19 (SEL2, second selection transistor) may always be turned off, and the first to eighth transistors 11 to 18 may be driven according to the timings of the control signals in FIG. 6. Thus, the sun spot is not generated in the global shutter mode. In particular, the ninth transistor 19 (SEL2, second selection transistor) between the second terminal of the third transistor 13 (SF, first source follow transistor) and the second terminal of the eighth transistor 18 (SEL1) may bypass the seventh transistor T17 (Sf, second selection transistor) to connect to the column line, which is connected to the clamping transistor Vclamp, one of which is provided in each column. The ninth transistors 19 (SEL2, second selection transistor) of the entire pixel 112 may be turned on during the reset settling time. When the ninth transistor 19 (SEL2, second selection transistor) is turned on, the output node of the third transistor 13 (SF, first source follow transistor) is clamped and the output of the third transistor 13 (SF, first source follow transistor) may be maintained at or above a predetermined voltage.

Figure 8:
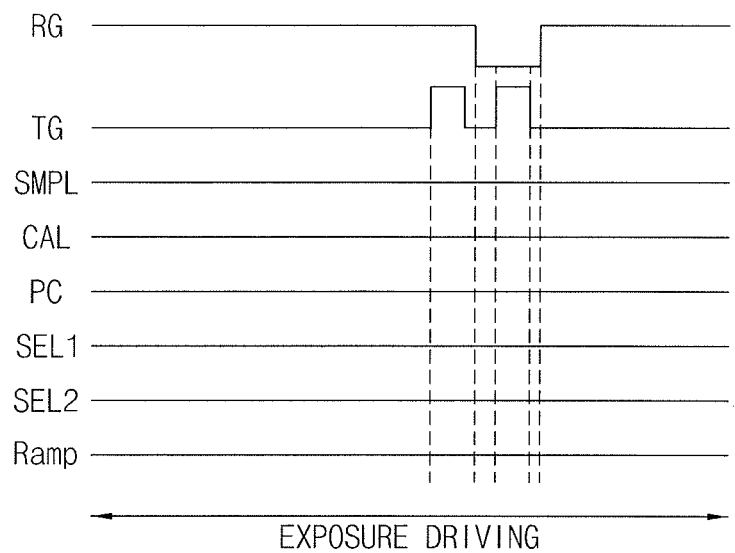
FIG. 8 illustrates a signal timing diagram for describing a driving method of the rolling shutter mode.
Figure 8:
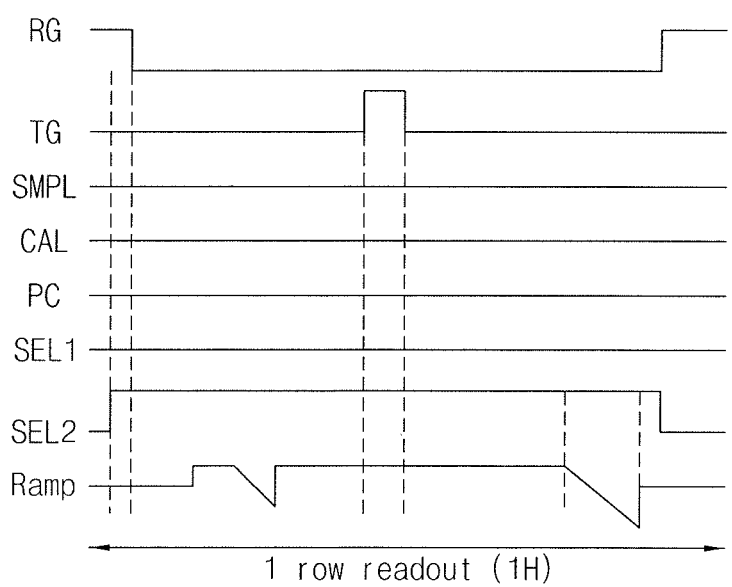

FIG. 8 is a signal timing diagram for describing a driving method of the rolling shutter mode. Referring to FIGS. 5 and 8, when the plurality of pixels 112 are operated in the rolling shutter mode, the ninth transistor 19 (SEL2, second selection transistor) may be turned off during the exposure driving. Thereafter, the ninth transistor 19 (SEL2, second selection transistor) may be turned on during the readout driving.

The fourth transistor 14 (PC, pre-charge transistor), the fifth transistor 15 (SMPL, sampling transistor), and the eighth transistor 18 (SEL1, first selection transistor) are always turned off during the exposure driving and the readout driving in the rolling shutter mode. Further, the sixth transistor 16 (CAL, calibration transistor) may always be turned off or may be turned on for a short time.

The fourth transistor 14 (PC, pre-charge transistor), the fifth transistor 15 (SMPL, sampling transistor), the sixth transistor 16 (CAL, calibration transistor), and the eighth transistor 18 (SEL1, first selection transistor) are turned off to reduce noise to a level of 4-TR pixels. The fourth transistor 14 (PC, pre-charge transistor) may always be turned off. The pixel may be operated in the rolling shutter mode at high speed while power saving by always turning off the fourth transistor 14 (PC, pre-charge transistor)

In the image sensor and the method driving the same, the image sensor may be operated in the rolling shutter mode when capturing a high-speed video and may be operated in the global shutter mode when capturing a still image and a low-speed video.

According to the exemplary embodiments, an output of a third transistor SF (first source follow transistor) can be maintained at or above a predetermined voltage by clamping an output node of the third transistor SF (first source follow transistor) during a reset settling time in which a sun spot is generated. Thus, the sun spot can be prevented from being generated in a global shutter mode operation.

According to the exemplary embodiments, image-capturing can be performed at high speed while performing power saving in a rolling shutter mode operation by always turning off a fourth transistor (pre-charge transistor)

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present invention as set forth in the following claims.

What is claimed is:
1. An image sensor, comprising:
 a pixel array in which a plurality of pixels are arranged;
 a row driver to supply a control signal to the plurality of pixels;
 a timing generator to control an operation of the row driver; and
 a readout circuit to output image signals of the plurality of pixels,
 wherein each of the plurality of pixels includes a photodiode and a pixel driving circuit, and the pixel driving circuit includes:
  a first transistor to transmit an output signal of the photodiode to a floating diffusion node,
  a second transistor to reset a voltage of the floating diffusion node to a pixel voltage,
  a third transistor to provide an output signal based on charges in the floating diffusion node,
  a fourth transistor to pre-charge an output node of the third transistor, a fifth transistor to directly receive the output signal of the third transistor and transmit the output signal of the third transistor to a first node, a sixth transistor to transmit the pixel voltage to a second node, a seventh transistor to provide an output signal based on charges in the second node, an eighth transistor to provide the output signal of the seventh transistor to a column line, a capacitor connected between the first node and the second node, and a ninth transistor to provide the output signal of the third transistor to the column line, wherein the first node only receives signals from the fifth transistor.

2. The image sensor as claimed in claim 1, wherein, when the plurality of pixels operate in a global shutter mode, the ninth transistor is turned on during a reset settling time and maintained in an off-state after the reset settling time, in accordance with a second selection control signal.

3. The image sensor as claimed in claim 2, wherein the ninth transistor clamps the output node of the third transistor so that an output voltage of the third transistor is constantly maintained.

4. The image sensor as claimed in claim 2, wherein, when the plurality of pixels operate in the global shutter mode, the first transistor is turned off during a reset settling time and turned on before a signal settling time.

5. The image sensor as claimed in claim 2, wherein, when the plurality of pixels operate in the global shutter mode, the second transistor is turned on before a reset settling time, turned off at the reset settling time, and maintained in an off-state during a signal settling time after the reset settling time.

6. The image sensor as claimed in claim 2, wherein, when the plurality of pixels operate in the global shutter mode, the fourth transistor is turned on before a reset settling time and maintained in an on-state until a signal settling time.

7. The image sensor as claimed in claim 2, wherein, when the plurality of pixels operate in the global shutter mode, the fifth transistor is turned on before a reset settling time and maintained in an on-state until a signal settling time.

8. The image sensor as claimed in claim 1, wherein a first terminal of the ninth transistor is connected to an output terminal of the third transistor and an input terminal of the fifth transistor, and a second terminal of the ninth transistor is connected to the column line.

9. The image sensor as claimed in claim 8, wherein the ninth transistor is connected to a clamping transistor connected to the column line.

10. An image sensor, comprising:
a pixel array in which a plurality of pixels are arranged;
a row driver to supply a control signal to the plurality of pixels;
a timing generator to control an operation of the row driver; and
a readout circuit to output image signals of the plurality of pixels,
wherein each of the plurality of pixels includes a photodiode and a pixel driving circuit, and the pixel driving circuit includes:
a first transistor to transmit an output signal of the photodiode to a floating diffusion node,
a second transistor to reset a voltage of the floating diffusion node to a pixel voltage,
a third transistor to provide an output signal based on charges in the floating diffusion node,
a fourth transistor to pre-charge an output node of the third transistor,
a fifth transistor to directly receive the output signal of the third transistor and transmit the output signal of the third transistor to a first node,
a sixth transistor to transmit the pixel voltage to a second node,
a seventh transistor to provide an output signal based on charges in the second node,
an eighth transistor to provide the output signal of the seventh transistor to a column line,
a capacitor connected between the first node and the second node, and
a ninth transistor to provide the output signal of the third transistor to the column line,
wherein the first node only receives signals from the fifth transistor,
wherein a clamping transistor is connected to the column line, and
wherein the clamping transistor, the photodiode, and the pixel driving circuit are distributed on a plurality of vertically stacked substrates.

11. The image sensor as claimed in claim 10, wherein the clamping transistor is on a first substrate, the photodiode and the pixel driving circuit are on a second substrate, and the second substrate is on the first substrate.

12. The image sensor as claimed in claim 10, wherein the clamping transistor is on a first substrate, the fifth to ninth transistors of the pixel driving circuit are on a second substrate, the first to fourth transistors of the pixel driving circuit and the photodiode are on a third substrate, the second substrate is on the first substrate, and the third substrate is on the second substrate.

13. The image sensor as claimed in claim 10, wherein the clamping transistor is on a first substrate, the fourth to ninth transistors of the pixel driving circuit are on a second substrate, the first to third transistors of the pixel driving circuit and the photodiode are on a third substrate, the second substrate is on the first substrate, and the third substrate is on the second substrate.

14. The image sensor as claimed in claim 10, wherein the clamping transistor is on a first substrate, the third to ninth transistors of the pixel driving circuit are on a second substrate, the first and second transistors of the pixel driving circuit and the photodiode are on a third substrate, the second substrate is on the first substrate, and the third substrate is on the second substrate.

15. The image sensor as claimed in claim 10, wherein the clamping transistor is on a first substrate, the second to ninth transistors of the pixel driving circuit are on a second substrate, the first transistor of the pixel driving circuit and the photodiode are on a third substrate, the second substrate is on the first substrate, and the third substrate is on the second substrate.

16. A method of driving an image sensor in a global shutter method, the image sensor including a plurality of pixels including a photodiode and a plurality of transistors, wherein each pixel includes:
a first transistor connected to the photodiode and a floating diffusion node;
a second transistor connected to the floating diffusion node and a pixel voltage;
a third transistor controlled by the floating diffusion node and connected to the pixel voltage;
a fourth transistor connected to the third transistor and ground;

a fifth transistor connected to the third transistor and a first node;
a sixth transistor connected to the fifth transistor and a second node;
a seventh transistor connected to the second node;
an eighth transistor connected to the seventh transistor and a column line; and
a ninth transistor between the third transistor and the column line, the method comprising:
directly receiving, at the fifth transistor, an output signal of the third transistor;
during a reset settling time, in which the fourth to sixth transistors are on, turning on the ninth transistor to output an output of the third transistor to the column line; and
turning off the sixth and ninth transistors after the reset settling time.

17. The method as claimed in claim 16, wherein the ninth transistor is connected to a clamping transistor connected to the column line, and the method further comprises maintaining the ninth transistor in an off-state after the reset settling time.

18. The method as claimed in claim 17, wherein turning on the ninth transistor clamps an output node of the third transistor so that an output voltage of the third transistor is constantly maintained.

19. The method as claimed in claim 17, further comprising turning the first transistor on after the reset settling time and before a signal settling time.

20. The method as claimed in claim 17, further comprising turning on the second transistor before the reset settling time, turning off the second transistor at the reset settling time, and maintaining the second transistor in an off-state during a signal settling time.

* * * * *